United States Patent
Sultan et al.

(10) Patent No.: US 8,076,703 B2
(45) Date of Patent: Dec. 13, 2011

(54) SEMICONDUCTOR DEVICE AND METHODS FOR FABRICATING SAME

(75) Inventors: Akif Sultan, Austin, TX (US); James F. Buller, Austin, TX (US); Kaveri Mathur, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 43 days.

(21) Appl. No.: 12/603,353

(22) Filed: Oct. 21, 2009

(65) Prior Publication Data

US 2010/0044761 A1 Feb. 25, 2010

Related U.S. Application Data

(62) Division of application No. 11/846,318, filed on Aug. 28, 2007, now Pat. No. 7,633,103.

(51) Int. Cl.
*H01L 29/78* (2006.01)

(52) U.S. Cl. ............. 257/288; 257/401; 257/36; 257/40

(58) Field of Classification Search .................. 257/390, 257/339–342, E27.046, E27.059, E27.06, 257/E27.061, E27.07, E27.081, E27.107, 257/288, 401, 36, 40; 438/128–130, 275, 438/278–279, 290, 587

See application file for complete search history.

(56) References Cited

U.S. PATENT DOCUMENTS

| | | | |
|---|---|---|---|
| 6,392,278 B1* | 5/2002 | Kimura | 257/401 |
| 7,420,202 B2* | 9/2008 | Adams et al. | 257/18 |
| 2005/0093030 A1* | 5/2005 | Doris et al. | 257/288 |
| 2007/0045747 A1* | 3/2007 | Kohyama | 257/365 |

OTHER PUBLICATIONS

Bo, Xiang-Zheng, et al. "Optimization of Dual-ESL Stressor Geometry Effects for High Performance 65nm SOI Transistors," 2006 IEEE International SOI Conference Proceedings. pp. 19-20.

* cited by examiner

*Primary Examiner* — Marcos D Pizarro Crespo
*Assistant Examiner* — Sue Tang
(74) *Attorney, Agent, or Firm* — Ingrassia Fisher & Lorenz, P.C.

(57) ABSTRACT

A semiconductor device is provided which includes a substrate including an inactive region and an active region, a gate electrode structure having portions overlying the active region, a compressive layer overlying the active region, and a tensile layer overlying the inactive region and located outside the active region. The active region has a lateral edge which defines a width of the active region, and a transverse edge which defines a length of the active region. The gate electrode structure includes: a common portion spaced apart from the active region; a plurality of gate electrode finger portions integral with the common portion, and a plurality of fillet portions integral with the common portion and the gate electrode finger portions. A portion of each gate electrode finger portion overlies the active region. The fillet portions are disposed between the common portion and the gate electrode finger portions, and do not overlie the active region. The compressive layer also overlies the gate electrode finger portions, and the tensile layer is disposed adjacent the transverse edge of the active region.

19 Claims, 8 Drawing Sheets

SEMICONDUCTOR DEVICE AND METHODS FOR FABRICATING SAME

CROSS-REFERENCE TO RELATED APPLICATION

This is a divisional application of U.S. patent application Ser. No. 11/846,318, filed Aug. 28, 2007.

TECHNICAL FIELD

The present invention generally relates to semiconductor devices and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors.

A MOS transistor includes a gate electrode as a control electrode, and a pair of spaced apart source and drain electrodes. A control voltage applied to the gate electrode controls the flow of a drive current through a channel that is established between the source and drain electrodes. When a MOS transistor is operating in its linear region (i.e., when the gate-to-source voltage ($V_{GS}$) is greater than a threshold voltage ($V_{th}$) and the drain-to-source voltage ($V_{DS}$) is less than the difference between the gate-to-source voltage and the threshold voltage ($V_{GS}-V_{th}$)), the MOS transistor turns on and a channel is created which allows the drive current to flow between the drain and source. The MOS transistor operates like a resistor, controlled by the gate voltage relative to both the source and drain voltages. The drive current ($I_D$) from drain to source can be modeled in equation (1) as:

$$I_D = \mu C_{ox} \frac{W}{L}\left((V_{GS}-V_{th})(V_{DS}) - \frac{V_{DS}^2}{2}\right) \quad \text{Equation (1)}$$

where $\mu$ is the charge-carrier effective mobility, W is the gate width, L is the gate length and $C_{ox}$ is the gate oxide capacitance per unit area. When the MOS transistor is operating in its saturation region (i.e., when the gate-to-source voltage ($V_{GS}$) is greater than a threshold voltage ($V_{th}$) and the drain-to-source voltage ($V_{DS}$) is greater than the difference between the gate-to-source voltage and the threshold voltage ($V_{GS}-V_{th}$)), the MOS transistor turns on and a channel is created which allows the drive current to flow between the drain and source. Since the drain voltage is higher than the gate voltage, a portion of the channel is turned off. The onset of this region is also known as pinch-off. The drain current is now relatively independent of the drain voltage. The drive current ($I_D$) from drain to source is controlled by the gate-to-source voltage ($V_{GS}$) and can be modeled in equation (2) as:

$$I_D = \mu \frac{C_{ox}}{2}\frac{W}{L}(V_{GS}-V_{th})^2. \quad \text{Equation (2)}$$

The complexity of ICs and the number of devices incorporated in ICs are continually increasing. As the number of devices in an IC increases, the size of individual devices decreases. Device size in an IC is usually noted by the minimum feature size; that is, the minimum line width or the minimum spacing that is allowed by the circuit design rules. As the semiconductor industry moves to a minimum feature size of 45 nanometers (nm) and even smaller, the gain of performance due to scaling becomes limited. As new generations of integrated circuits and the MOS transistors that are used to implement those ICs are designed, technologists must rely heavily on non-conventional elements to boost device performance.

As noted above, the performance of a MOS transistor, as measured by its current carrying capability, is proportional to the mobility of a majority carrier in the transistor's channel. By applying an appropriate uniaxial stress to the channel of the MOS transistor, the mobility of the majority carrier in the channel can be increased which increases drive current thereby improving performance of the MOS transistor. For example, applying a compressive uniaxial stress to the channel of a P-channel MOS (PMOS) transistor enhances the mobility of majority carrier holes, whereas applying a tensile uniaxial stress to the channel of an N-channel MOS (NMOS) transistor enhances the mobility of majority carrier electrons. The known stress engineering methods greatly enhance circuit performance by increasing device drive current without increasing device size and device capacitance.

It is desirable to provide improved stress enhanced semiconductor devices and methods for fabricating such stress enhanced semiconductor devices. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment, a semiconductor device is provided which includes a substrate comprising an inactive region and an active region, a gate electrode structure having portions overlying the active region, a compressive layer overlying the active region, and a tensile layer overlying the inactive region and located outside the active region. The active region has a lateral edge which defines a width of the active region, and a transverse edge which defines a length of the active region. The gate electrode structure comprises: a common portion spaced apart from the active region by a first distance, a plurality of gate electrode finger portions integral with the common portion, and a plurality of fillet portions integral with the common portion and the gate electrode finger portions. A portion of each gate electrode finger portion overlies the active region, and the gate length of each gate electrode finger portion which overlies the active region is substantially uniform. The fillet portions are disposed between the common portion and the gate electrode finger portions, and do not overlie the active region. The compressive layer overlies the gate electrode finger portions, and the tensile layer is disposed adjacent the transverse edge of the active region.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

Figure 1:
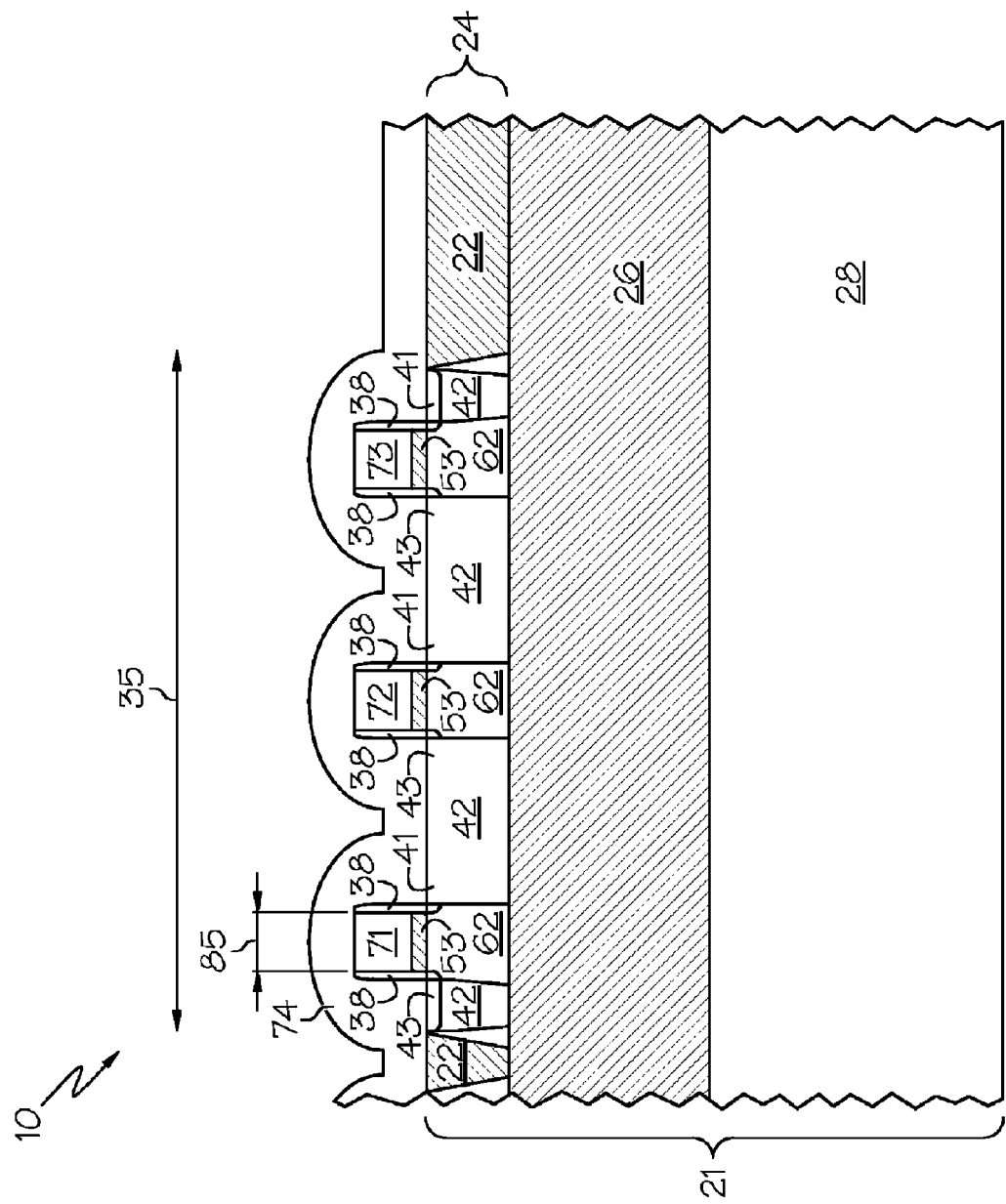
FIG. 1 illustrates, in cross section, a stress enhanced P-channel MOS (PMOS) semiconductor device.

FIG. 1 illustrates, in cross section, a stress enhanced P-channel MOS (PMOS) transistor 10. Those of skill in the art will understand that the transistor 10 can be implemented as part of an integrated circuit which includes a large number of transistors that are interconnected to perform a particular circuit function being implemented.

Various steps in the manufacture of PMOS transistors are well known and so, in the interest of brevity, many conventional steps will only be mentioned briefly herein or will be omitted entirely without providing the well-known process details. Although the term "MOS transistor" properly refers to a device having a metal gate electrode and an oxide gate insulator, that term will be used throughout to refer to any semiconductor device that includes a conductive gate electrode (whether metal or other conductive material) that is positioned overlying a gate insulator (whether oxide or other insulator) which, in turn, is positioned overlying a semiconductor substrate (whether silicon or other semiconductor material).

As illustrated in FIG. 1, a semiconductor structure 21 is provided in and on which the PMOS device 10 will be fabricated. The semiconductor structure 21 can be either a bulk semiconductor material or a semiconductor-on-insulator (SOI) structure 21 as illustrated in the embodiment of FIG. 1. The SOI structure 21 illustrated in FIG. 1 comprises at least one thin layer of semiconductor material 24 disposed on or overlying a buried oxide insulating layer 26 which, in turn, is supported by a carrier wafer or substrate 28 so that the buried oxide insulating layer 26 is disposed between the carrier wafer 28 and the semiconductor layer 24. The semiconductor layer 24 can be a thin silicon layer, a germanium layer, a gallium arsenide layer, or other semiconductor materials. In one embodiment, the semiconductor material layer 24 comprises a thin monocrystalline layer of silicon on the buried oxide insulating layer 26. The semiconductor layer 24 can be impurity doped with N-type conductivity determining impurities to create N-well region 62 in the semiconductor layer 24. Impurity doping can take place, for example, by the implantation and subsequent thermal annealing of dopant ions such as phosphorus and arsenic.

Either before or after the N-well region 62 is formed, inactive regions 22 are formed in the semiconductor layer 24. There are many known processes that can be used to form the inactive regions 22, so the process are not described here in detail. One process for forming the inactive regions 22 is a shallow trench isolation (STI) process. In general, STI processes involve providing an etch mask which selectively exposes portions of the semiconductor layer 24 which correspond to inactive regions 22 and which selectively covers other portions of the semiconductor layer 24. Shallow trenches are then etched into the surface of the semiconductor layer 24 which are subsequently filled with an insulating dielectric material. After the trenches are filled with an insulating material, such as an oxide ($SiO_2$), the surface is planarized, for example by chemical mechanical planarization (CMP).

A layer of gate insulating material 53 is formed overlying the impurity-doped N-well regions 62 and gate electrode finger portions 71-73 are formed overlying the gate insulating material 53 and impurity-doped N-well region 62, respectively. After the gate electrode finger portions 71-73 have been formed, a mask layer (not shown) can optionally be formed overlying the gate electrode finger portions 71-73, and at least a surface portion of the N-well regions 62 can be impurity doped with P-type conductivity determining impurities to create lightly doped extension regions 41, 43. Sidewall spacers 38 are formed on the sidewalls of the various gate electrode finger portions 71-73 by depositing a layer of insulating material such as silicon oxide and/or silicon nitride and subsequently anisotropically etching the insulating layer, for example by reactive ion etching (RIE). A layer of masking material, which can be, for example, a layer of photoresist, is applied and patterned to expose portions of each N-well region 62. Using this layer of patterned mask material as an ion implantation mask, P-type conductivity determining ions such as boron ions are implanted into exposed portions of the gate electrode finger portions 71-73 and into the exposed portions of the N-well region 62 to form P-type source/drain regions 42.

At this stage of processing, the semiconductor substrate 24 includes a PMOS device 10 which includes active source/drain regions 42 formed therein and gate electrode stacks formed thereon. Each gate electrode stack comprises a gate insulator layer 53, a gate electrode finger portion 71-73 overlying the respective gate insulator layers 53, and spacers 38 adjacent the respective gate electrode finger portions 71-73.

To improve performance of the PMOS device 10, stress along the channel region is enhanced by depositing a compressive stress layer 74 overlying the PMOS transistor. The compressive stress layer 74 is formed of an appropriate electrically insulating material, such as, a layer of stressed silicon nitride (SiN). The layer of SiN can be deposited, for example, by LPCVD or PECVD from reactants including dichlorosilane and ammonia. Although not shown, the compressive stress layer 74 is then patterned to remove portions which overlie at least some portions of the inactive region(s). The deposition conditions, reactants, and reactant flows can be adjusted, as is well known, to deposit a compressive stress layer.

Although not shown in FIG. 1, the stress enhanced PMOS device 10 can be completed in conventional manner. Conventional steps include, for example, forming metal silicide contacts on the source/drain regions 42 and the gate electrodes 71-73, depositing interlayer dielectric layers, planarizing the interlayer dielectric layers, and etching contact vias or openings through the dielectric layer to the metal silicide contacts. Electrical contact to the source/drain regions 42 and the gate electrodes 71-73 can then be made by contact plugs formed in contact openings and by interconnect metal deposition and patterning.

Figure 2:
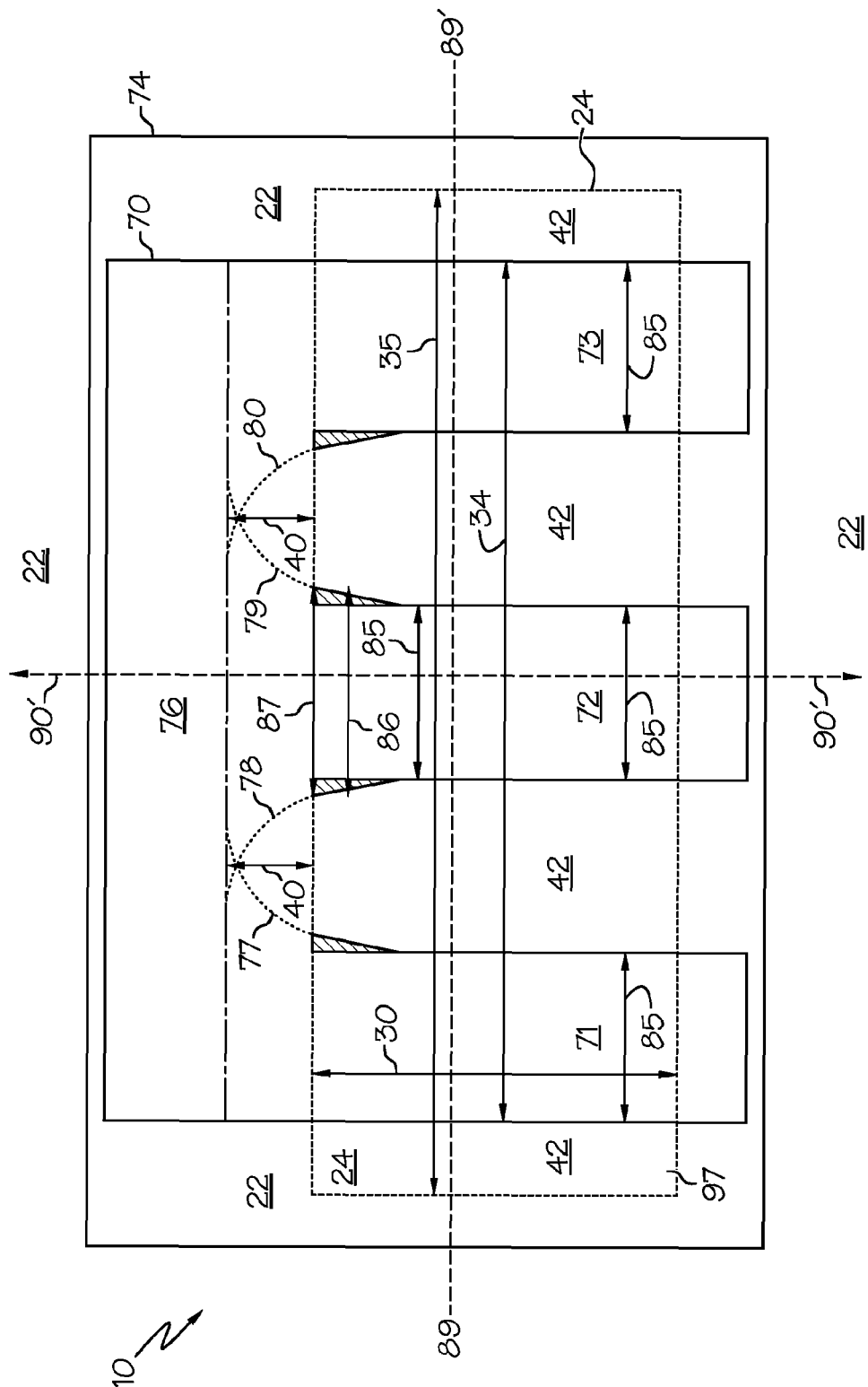
FIG. 2 illustrates a top view of the stress enhanced PMOS semiconductor device of FIG. 1.

FIG. 2 illustrates a top view of the stress enhanced P-channel MOS (PMOS) transistor 10 of FIG. 1.

The PMOS device 10 includes polysilicon gate electrode finger portions 71-73, and source/drain regions 42. The respective polysilicon gate electrode finger portions 71-73 overlie a portion of an active region 24 which is defined within a portion of a substrate and has an active width 30. The PMOS device 10 includes an active region 24 which is designed to have certain drive current capabilities. The drive current is proportional to an active width 30 of the gate electrode finger portions 71-73 and carrier mobility in channel regions underlying the gate electrode finger portions 71-73, and is inversely proportional to gate lengths 85 of gate electrode finger portions 71-73. The layout of the active region 24 and the gate electrode finger portions 71-73 is designed to meet drive current capabilities for the transistor 10.

During the process of forming the gate electrode finger portions 71-73, a layer of photoresist is applied overlying a layer of polysilicon which eventually forms the polysilicon gate electrode finger portions 71-73. The layer of photoresist is patterned to form an etch mask which exposes portions of the polysilicon layer that are to be removed. Due to resolution limits of photolithography, the photoresist does not always pattern in a linear manner, and as a result the etch mask can include rounding near corner regions of the etch mask. When portions of the polysilicon layer are removed to form the gate electrode finger portions 71-73, a phenomenon sometimes referred to as "corner rounding" occurs in which the pattern of the each mask, including the rounded corners, is transferred to the layer of polysilicon when forming the gate electrode finger portions 71-73. This causes fillet-shaped portions 77-80 to be formed between the gate electrode finger portions 71-73, which overlie and overlap a portion of the active region 24 as indicated by cross-hatching in FIG. 2. For instance, the cross-hatches portions of the fillet portions 78, 79 of gate electrode 72 overlie and overlap a portion of the active region 24. Corner rounding is undesirable since it causes variations in the gate lengths of the polysilicon gate electrode finger portions 71-73 in the areas which include fillet portions 77, 78, 79, 80, respectively. For example, as illustrated in FIG. 2, the gate lengths (illustrated by double headed arrows 85, 86, 87) of gate electrode 72 vary in an unpredictable manner in the areas which include fillet portions 78, 79. The varying gate lengths 85-87 cause variations in drive current and overall performance of the transistor 10.

Unfortunately, as critical dimensions of the transistor 10 become smaller it becomes increasingly difficult to pattern the polysilicon layer (which forms the gate electrode finger portions 71-73) such that patterned boundaries of the gate polysilicon material do not exhibit corner rounding effects. To address the "corner rounding" problem, one technique is to simply increase the distance 40 between the gate electrode finger portions 71-73 and the active region 24 so that the corner/fillet portions 77-80 of the gate electrode finger portions 71-73 do not overlap or overlie the active region 24. However, this approach increases the overall layout area which is very undesirable particularly as critical dimensions of the transistor 10 are scaled downward.

Accordingly, it is desirable to provide an improved stress enhanced semiconductor device which does not suffer from variability caused by corner rounding of the gate electrodes. It is also desirable to provide improved methods for fabricating such a stress enhanced semiconductor device which can reduce or eliminate the impact of corner rounding without increasing layout area of the semiconductor device. As described below, techniques are provided for increasing the effective compressive stress along a channel defined in an active region of a PMOS transistor so that an active width can be reduced without altering drive current capability of the PMOS transistor and without increasing the overall layout area of the PMOS transistor. By reducing the active width, any fillet portions can be disposed so that they do not overlap or overlie the active region thereby allowing variations in the gate length to be reduced or completely eliminated.

Figure 3:
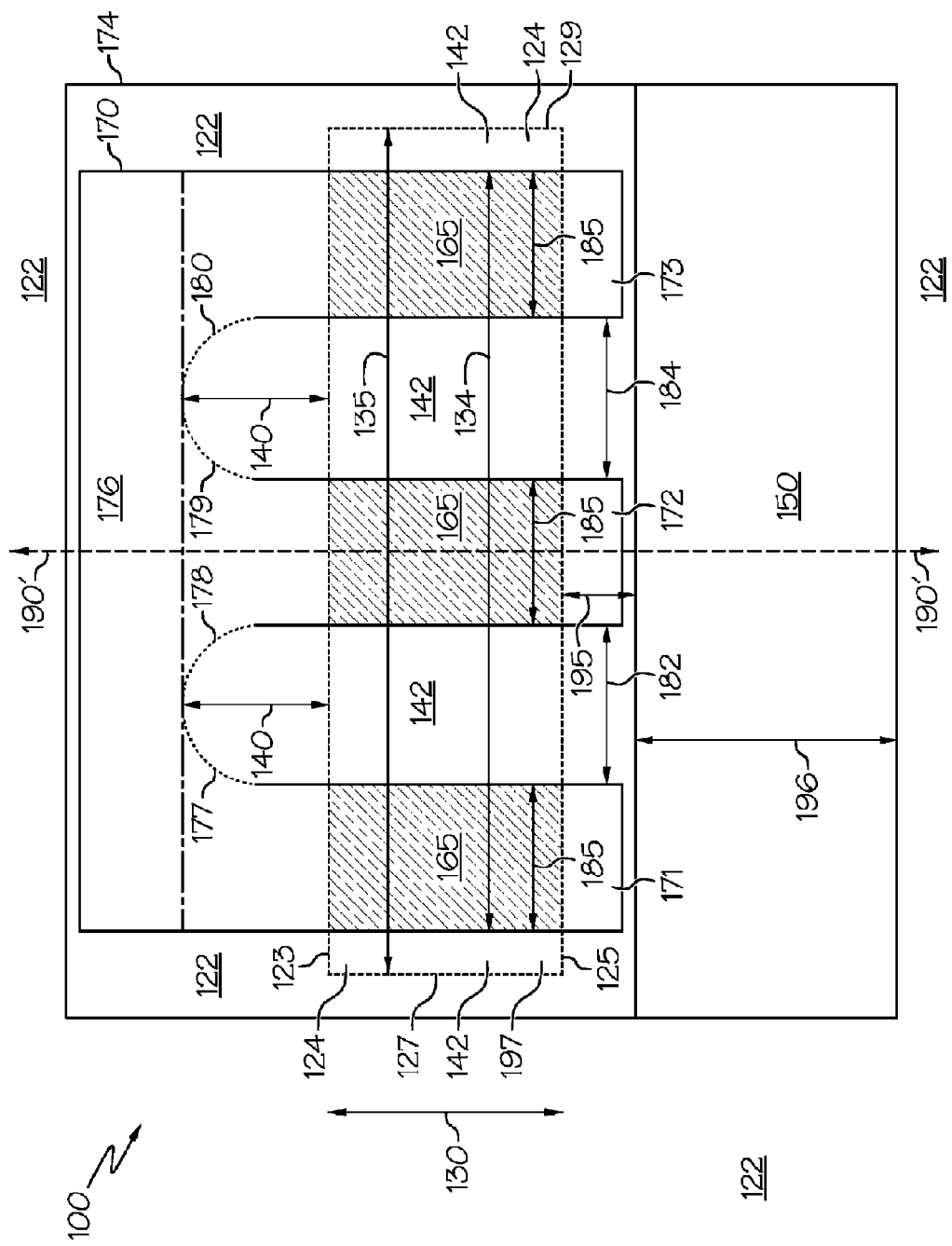
FIG. 3 illustrates a top view of a portion of a stress enhanced semiconductor device in accordance with various embodiments of the invention.

FIG. 3 illustrates a top view of a portion of the stress enhanced PMOS device 100 in accordance with various embodiments of the invention. The stress enhanced PMOS device 100 includes an active region 124, a compressive layer 174 and a tensile layer 150 outside the active region 124. In top view, the areas outside the active region 124 make up inactive region 122. The PMOS device 100 also includes a gate electrode structure 170 including gate electrode finger portions 171-173, and source/drain regions 142 formed in portions of the active region 124.

The active region 124 is defined by transverse edges 123, 125 and lateral edges 127, 129. The lateral edges 127, 129 define an active width 130 of the active region 124, and extend along a lateral dimension of the active region 124. The active width 130 is defined between transverse edge 125 and transverse edge 123. The transverse edge 123 is closer to a common portion 176 than the transverse edge 125. The transverse edges 123, 125 extend along a transverse dimension of the active region 124 and have a length defined by double-headed arrow 135. In one implementation, the active width 130 is between 0.1 μm and 1.0 μm, and length 135 of the active region 124 is between depends on the number of gate electrode finger portions 171-173 on the active region 124.

The gate electrode structure 170 includes a common portion 176, and the gate electrode finger portions 171-173 which are integral with the common portion 176. Adjacent gate electrode finger portion portions 171/172, 172/173 are spaced apart from each other by a distance illustrated by double-headed arrows 182, 184. The gate electrode finger portions 171-173 overlie the active region 124 such that a portion 165 of each gate electrode finger portion 171-173 extends over the active region 124. During formation/fabrication of the gate electrode finger portions 171-173, "corner rounding" occurs which causes fillet portions 177-180 to form which are integral with the common portion 176 and the gate electrode finger portions 171-173. As illustrated in FIG. 3, the fillet portions 177-180 are concave-shaped areas of the gate electrode structure 170 which are located along the interior corner portions of the gate electrode structure 170 between side portions of the gate electrode finger portions 171-173 and common portion 176. The common portion 176 is spaced apart from the active region 124 by a distance defined by double-headed arrow 140 so that the fillet portions 177-180 do not overlie or overlap the active region 124. As such, the portions 165 of each gate electrode finger portion 171-173 which overlie the active region 124 each have a gate length (defined by double-headed arrow 185) that is substantially uniform.

The compressive layer 174 overlies the active region 124 and at least the gate electrode finger portions 171-173 to enhance mobility of holes in the channel regions underlying the gate electrode finger portions 171-173. In one implementation, the compressive layer 174 comprises a layer of Compressive Plasma Enhanced Nitride (CPEN).

The tensile layer 150 overlies at least a portion of the inactive region 122, and is disposed adjacent the transverse edge 125 of the active region 124. In this context, the term "adjacent" can mean near, in proximity to, beside, bordering, neighboring, close to, next to, but not touching. As such, the tensile layer 150 does not contact the active region 124, but can be near, in proximity to, beside, bordering, close to, next to but not touching the active region 124. In one implementation, the tensile layer 150 comprises a layer of Tensile Plasma Enhanced Nitride (TPEN). As illustrated in FIG. 3, the tensile layer 150 is spaced apart from the active region 124 by a distance 195 so that the tensile layer 150 does not contact or overlap with the active region 124. In one implementation, the tensile layer 150 is spaced apart from the active region 124 by a distance 195 of at least 0.02 µm, and the distance 140 is between 0.01 µm and 0.04 µm. It will be appreciated that these distances can possible reduce in the future implementations.

When disposed in this manner relative to the active region 124, the tensile layer 150 increases stress in the active region 124 to increase drive current in the active region 124. Increased drive current allows the active width 130 to be reduced without altering or changing the drive current capability of the PMOS device 100. Decreasing active width 130 allows a distance (defined by double-headed arrow 140) between the common portion 176 and the active region 124 to be increased without increasing total device size beyond that in FIG. 2. By increasing the distance 140 between the common portion 176 and the active region 124, the fillet portions 177-180 can be spaced apart from the active region 124 such that they are non-overlapping and non-overlying the active region 124. As such, there are less variations in gate lengths of the transistor 100 due to corner rounding associated with the fillet portions 177-180. For example, the active portions 165 of each gate electrode finger portion 171-173 which overlie the active region 124 have a gate length (defined by double-headed arrow 185) that is substantially uniform. Accordingly, the distance 140 can be increased without increasing layout area occupied by the transistor 100, and variations in the gate lengths 185 can be reduced or eliminated so that the device 100 does not suffer from variations caused by corner rounding.

FIGS. 4-8 illustrate, in cross section, the PMOS stress enhanced transistor 100 of FIG. 3, and method steps for its fabrication in accordance with various embodiments of the invention. The cross sections illustrated in FIGS. 4-8 are taken along line 190-190' of FIG. 3.

Figure 4:
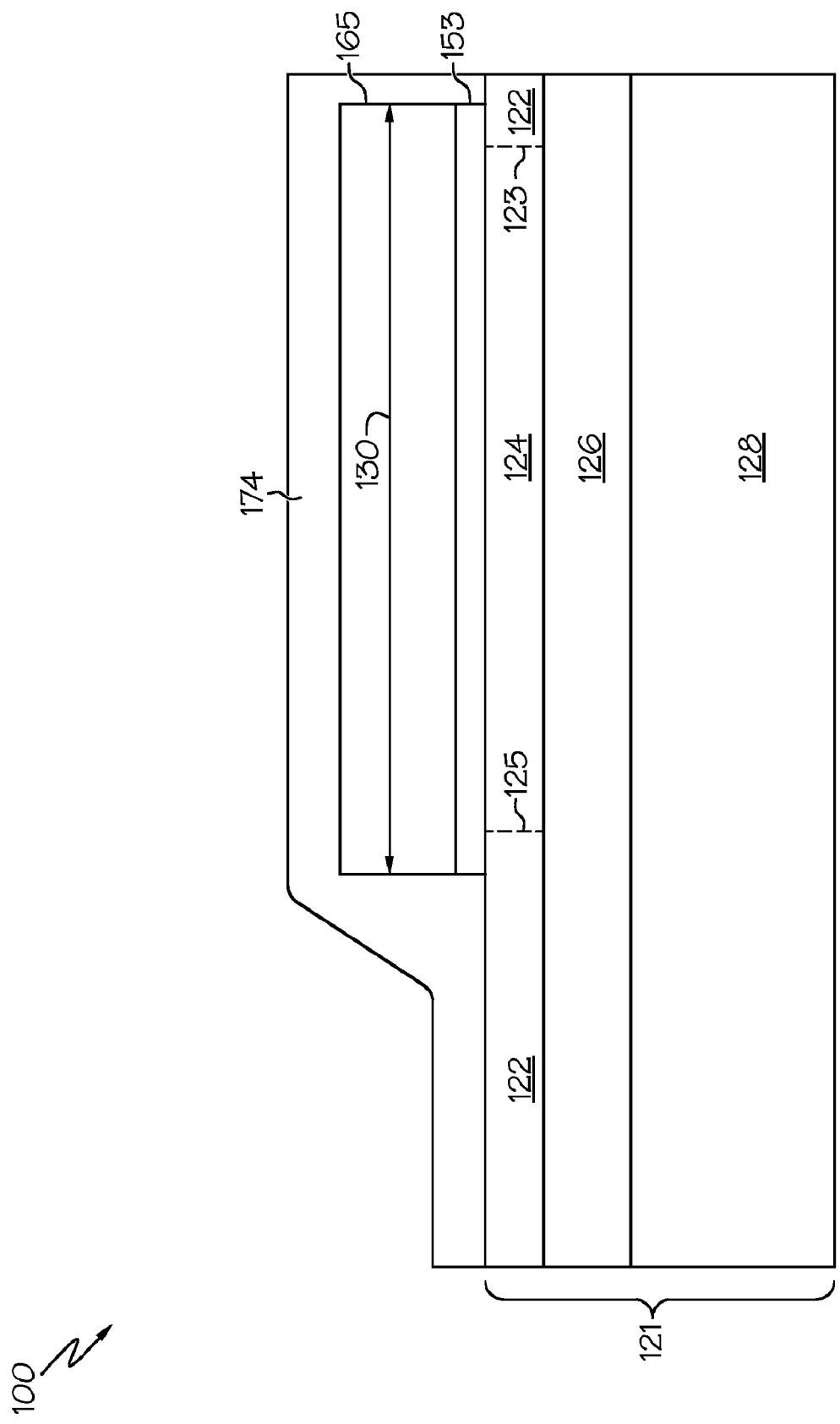
FIGS. 4-8 illustrate, in cross section, the PMOS stress enhanced semiconductor device of FIG. 3, and method steps for its fabrication in accordance with various embodiments of the invention.

In processing that occurs prior to FIG. 4, inactive regions 122 have been formed overlying the buried oxide layer 125 as illustrated in FIG. 4, or alternatively within the substrate 121 in embodiments where a bulk substrate is utilized. An active region 124 has been defined in the substrate 121, a gate electrode stack 153, 165 has been fabricated overlying the active region 124, and a compressive stress layer 174 has been blanket deposited overlying the gate electrode stack 153, 165 and the semiconductor layer 124. The compressive stress layer 174 enhances stress along a channel region of the PMOS device 100 to improve charge-carrier mobility and thereby improve performance of the PMOS device 100. The compressive layer 174 can have a thickness between 50 nm and 75 nm, and is formed of an appropriate electrically insulating material, such as, a layer of stressed silicon nitride (SiN).

Figure 5:
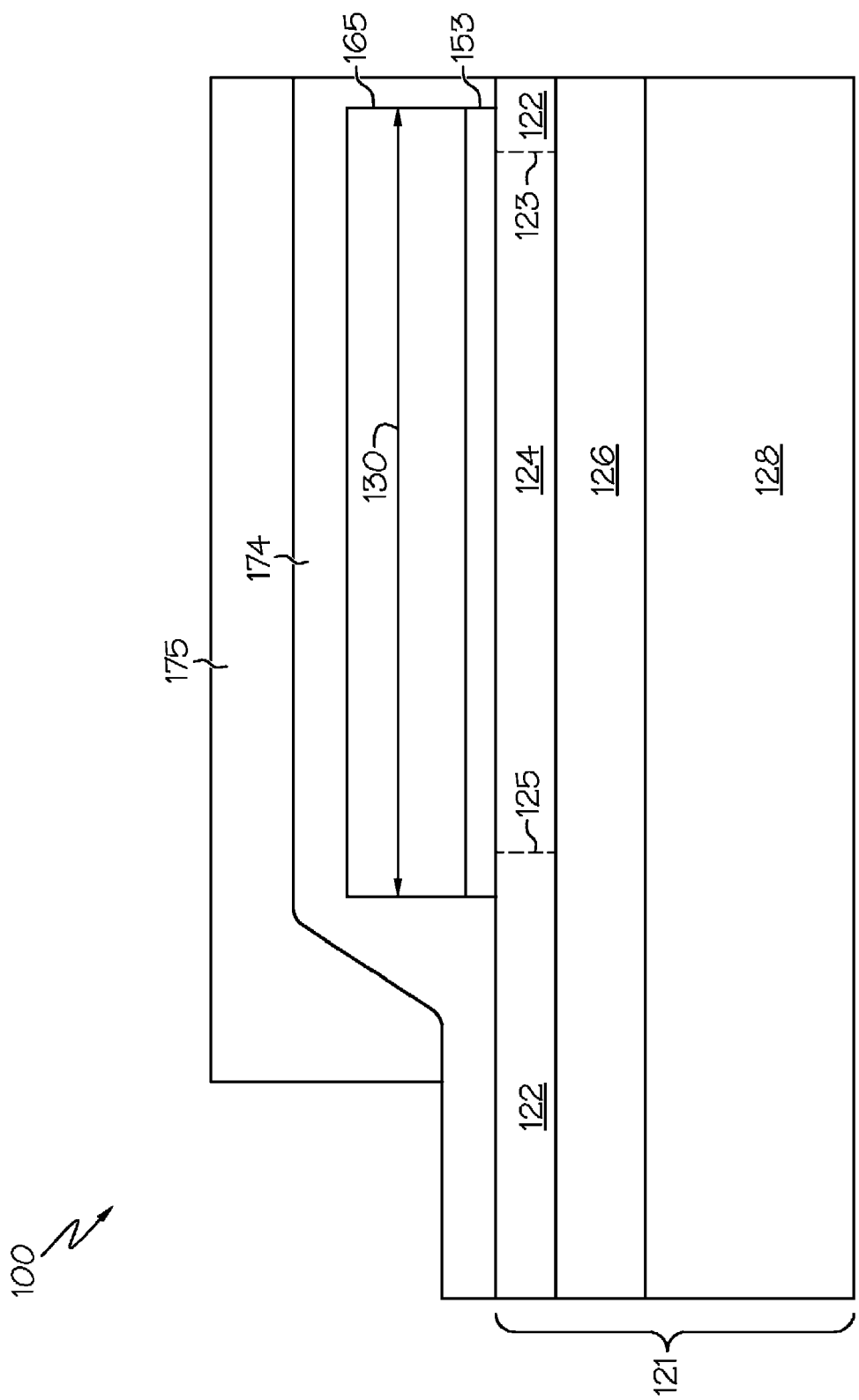

As illustrated in FIG. 5, a layer of masking material 175, which can be, for example, a layer of photoresist, is applied overlying the compressive stress layer 174, and is patterned to expose portions of the compressive stress layer 174 overlying a portion of inactive region 122. Using the patterned mask 175, exposed portions of the compressive stress layer 174 are removed to expose a portion of the inactive region 122.

Figure 6:
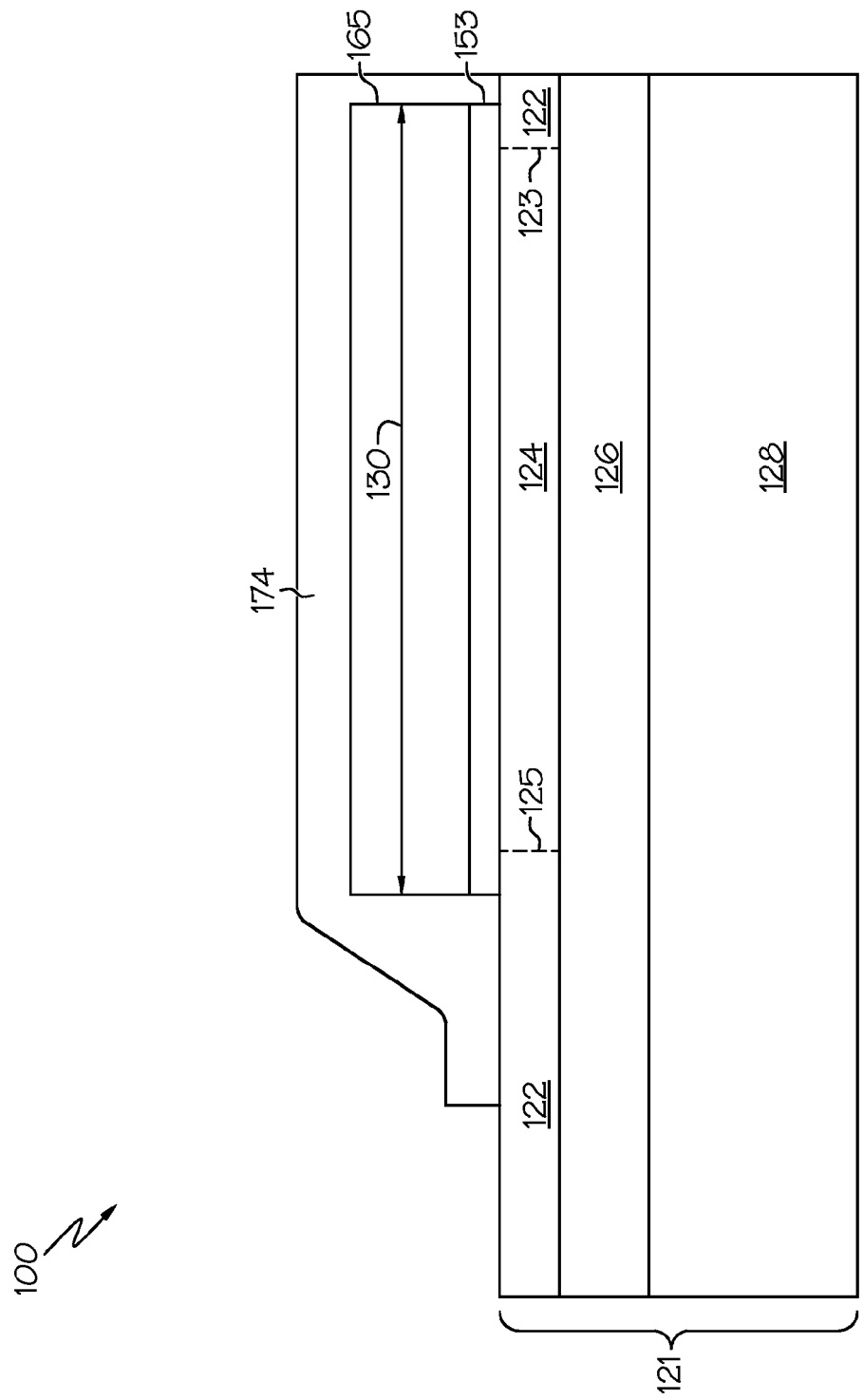
Figure 7:
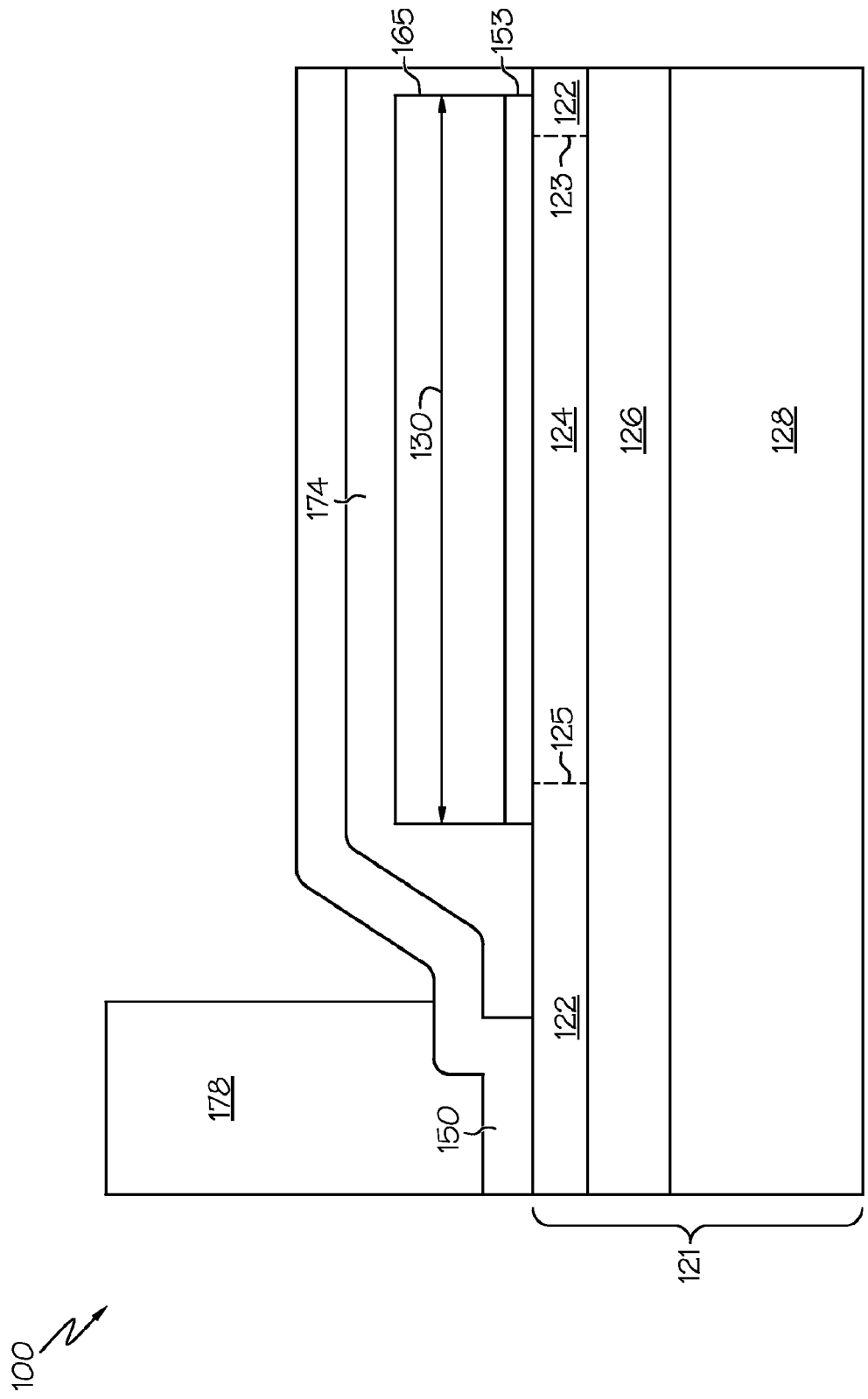

As illustrated in FIG. 6, the layer of patterned mask material 175 can be removed, and as illustrated in FIG. 7, a layer of tensile material 150 is deposited which can be formed of an electrically insulating material such as a layer of stressed silicon nitride (SiN). The tensile layer 150 increases compressive stress caused by the compressive stress layer 174 overlying the active region 124.

As illustrated in FIG. 7, a layer of masking material 178, which can be, for example, a layer of photoresist, is applied overlying a portion of the tensile stress layer 150, and is patterned to expose portions of the tensile stress layer 150 overlying the active region 124. Using the patterned mask 178, exposed portions of the tensile stress layer 150 are removed to expose a portion of the compressive stress layer 174 which overlies the active region 124. The remaining portion of the tensile stress layer 150 overlying the exposed portions of the inactive region 122 is spaced apart from the active region 124 by a minimum distance 195, but does not contact or overlap with the active region 124.

As noted above, by increasing stress in the active region 124, drive current in the active region 124 is increased which allows the active width 130 to be reduced. Decreasing active width 130 allows a distance (defined by double-headed arrow 140) between the common portion 176 and the active region 124 to be increased so that the fillet portions 177-180 can be spaced apart from the active region 124 such that the fillet portions 177-180 are non-overlapping and non-overlying the active region 124. As such, the portions 165 of each gate electrode finger portion 171-173 which overlie the active region 124 have a gate length (defined by double-headed arrow 185) that is substantially uniform without increasing layout area occupied by the transistor 100 and without altering drive current capabilities of the transistor 100.

Figure 8:
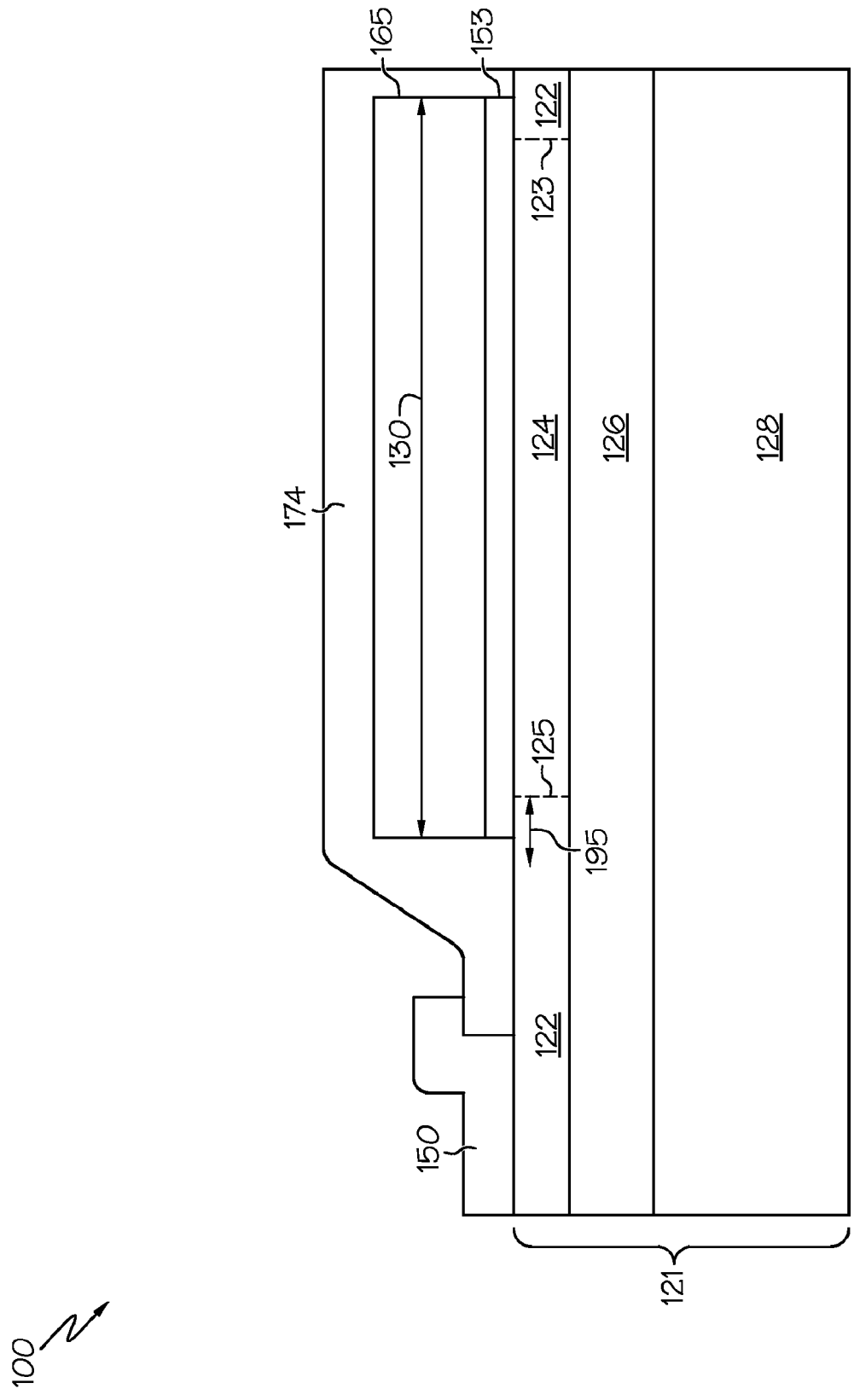

Although not shown in FIG. 8, the stress enhanced PMOS device 100 can be completed in conventional manner. Conventional steps include, for example, forming metal silicide contacts on the source and drain regions 142, depositing interlayer dielectric layers, planarizing the interlayer dielectric layers, and etching contact vias or openings through the dielectric layer to the metal silicide contacts. Electrical contact to the source and drain regions 142 and the gate electrodes 171-173 can then be made by contact plugs formed in contact openings and by interconnect metal deposition and patterning.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A stress-enhanced semiconductor device, comprising:
   a substrate comprising an inactive region and an active region, wherein the active region comprises: a lateral edge which defines an active width of the active region, and a transverse edge which defines a length of the active region;
   a gate electrode structure comprising:
      a common portion spaced apart from the active region by a first distance; and
      a plurality of gate electrode finger portions integral with the common portion, wherein a portion of each gate electrode finger portion overlies the active region, wherein a gate length of the portion of each gate electrode finger portion which overlies the active region is substantially uniform; and
a compressive layer overlying the active region and the gate electrode finger portions; and
a tensile layer overlying the inactive region, the tensile layer being disposed adjacent the transverse edge of the active region so that the tensile layer does not overlie the gate electrode structure, wherein a portion of the tensile layer overlaps with a portion of the compressive layer.

2. A stress-enhanced semiconductor device according to claim 1, wherein the gate electrode structure further comprises:
a plurality of fillet portions integral with the common portion and the gate electrode finger portions, wherein the fillet portions have a concave-shaped edge and are disposed between the common portion and the gate electrode finger portions, and wherein the fillet portions do not overlie the active region.

3. A stress-enhanced semiconductor device according to claim 2, wherein the active width is between 0.1 μm and 1.0 μm, and wherein the first distance is between 0.01 μm and 0.04 μm so that the fillet portions do not overlie the active region to reduce variations in gate length of the portion of each gate electrode finger portion which overlie the active region due to corner rounding of the fillet portions.

4. A stress-enhanced semiconductor device according to claim 2, wherein the tensile layer increases stress in the active region to increase drive current in the active region so that an active width is reduced and the fillet portions are non-overlying the active region without increasing layout area occupied by the semiconductor device.

5. A stress-enhanced semiconductor device according to claim 1, wherein the tensile layer disposed adjacent the active region, the gate electrode finger portions, and the compressive layer, and wherein the tensile layer does not overlie the gate electrode finger portions.

6. A stress-enhanced semiconductor device according to claim 1, wherein the tensile layer is spaced apart from the active region by a distance of at least 0.02 μm.

7. A stress-enhanced semiconductor device comprising:
a substrate comprising an inactive region and an active region, wherein the active region comprises: a lateral edge which defines an active width of the active region, and a transverse edge which defines a length of the active region;
a gate electrode structure having portions overlying the active region, wherein the gate electrode structure comprises: a common portion, a plurality of gate electrode finger portions integral with the common portion; and a plurality of fillet portions integral with the common portion and the gate electrode finger portions, wherein the fillet portions do not overlie the active region;
a compressive layer overlying the active region and the gate electrode structure; and
a tensile layer overlying the inactive region, the tensile layer being disposed adjacent the transverse edge of the active region so that the tensile layer does not overlie the gate electrode structure, wherein a portion of the tensile layer overlaps with a portion of the compressive layer.

8. A stress-enhanced semiconductor device according to claim 7, wherein the common portion is spaced apart from the active region by a first distance; wherein a portion of each gate electrode finger portion overlie the active region, wherein a gate length of the portion of each gate electrode finger portion which overlies the active region is substantially uniform; and wherein the fillet portions have a concave-shaped edge and are disposed between the common portion and the gate electrode finger portions.

9. A stress-enhanced semiconductor device according to claim 8, wherein the active width is between 0.1 μm and 1.0 μm, and wherein the first distance is between 0.01 μm and 0.04 μm so that the fillet portions do not overlie the active region to reduce variations in a gate length of the portion of each gate electrode finger portion which overlie the active region.

10. A stress-enhanced semiconductor device according to claim 8, wherein the tensile layer is disposed adjacent the active region and does not contact and does not overlie the active region, wherein the tensile layer overlies a portion of the compressive layer that does not overlap with the active region, wherein the tensile layer increases stress in the active region to increase drive current in the active region so that the fillet portions are non-overlying the active region without increasing layout area occupied by the semiconductor device.

11. A stress-enhanced semiconductor device according to claim 7, wherein the tensile layer is spaced apart from the active region by a distance of at least 0.02 μm.

12. A stress-enhanced semiconductor device, comprising:
a substrate comprising an inactive region and an active region;
a gate electrode structure having a portion overlying the active region, the gate electrode structure comprising: a common portion; a plurality of gate electrode finger portions integral with the common portion; and a plurality of fillet portions integral with the common portion and the gate electrode finger portions, wherein the fillet portions are non-overlying the active region;
a compressive stress layer overlying the active region and the gate electrode finger portions;
a tensile stress layer overlying a portion of the inactive region that is spaced apart from the active region and in contact with the inactive region, wherein a portion of the tensile stress layer overlaps with a portion of the compressive stress layer, wherein the tensile stress layer does not overlie the gate electrode structure and is non-overlapping with the active region.

13. A stress-enhanced semiconductor device according to claim 12, wherein the common portion is spaced apart from the active region by a first distance.

14. A stress-enhanced semiconductor device according to claim 13, wherein the first distance is between 0.01 μm and 0.04 μm to reduce variations in a gate length of the portion of each gate electrode finger portion which overlie the active region due to corner rounding of the fillet portions.

15. A stress-enhanced semiconductor device according to claim 12, wherein a portion of each gate electrode finger portion overlies the active region, and wherein a gate length of the portion of each gate electrode finger portion which overlies the active region is substantially uniform.

16. A stress-enhanced semiconductor device according to claim 12, wherein the fillet portions are located along interior corner portions of the gate electrode structure between side portions of the gate electrode finger portions and the common portion and have a concave-shaped edge and are disposed between the common portion and the gate electrode finger portions.

17. A stress-enhanced semiconductor device according to claim 12, wherein the tensile layer is spaced apart from the active region by a distance of at least 0.02 μm.

18. A stress-enhanced semiconductor device according to claim 12, wherein the active region comprises: a lateral edge which defines an active width of the active region, and a transverse edge which defines a length of the active region, and wherein the active width is between 0.1 μm and 1.0 μm, wherein the inactive region contacts the transverse edge of the active region.

19. A stress-enhanced semiconductor device according to claim 12, wherein the tensile stress layer increases compressive stress of the compressive stress layer overlying the active region and increases stress in the active region to increase drive current in the active region.

* * * * *